(12) United States Patent
Kossor

(10) Patent No.: US 6,430,403 B1
(45) Date of Patent: Aug. 6, 2002

(54) TEMPERATURE COMPENSATED, ZERO BIAS RF DETECTOR CIRCUIT

(75) Inventor: Michael G. Kossor, Kenilworth, NJ (US)

(73) Assignee: Lucent Technologies Inc., Murray Hill, NJ (US)

( * ) Notice: Subject to any disclaimer, the term of this patent is extended or adjusted under 35 U.S.C. 154(b) by 0 days.

(21) Appl. No.: 09/329,324

(22) Filed: Jun. 10, 1999

(51) Int. Cl.$^7$ ................................................ H04B 1/04
(52) U.S. Cl. ..................... 455/126; 455/127; 455/240; 455/259; 455/260; 330/289; 330/298
(58) Field of Search ................................ 330/289, 298; 455/126, 127, 240, 241, 242, 250.1, 251.1, 259, 260, 235.1, 245.1

(56) References Cited

U.S. PATENT DOCUMENTS

| | | | | |
|---|---|---|---|---|
| 5,873,029 A | * | 2/1999 | Grondahl | 455/126 |
| 5,956,627 A | * | 9/1999 | Goos | 455/127 |
| 5,963,087 A | * | 10/1999 | Anderson | 330/52 |
| 6,240,144 B1 | * | 5/2001 | Ha | 375/297 |

* cited by examiner

Primary Examiner—William Trost
Assistant Examiner—Danh C Le
(74) Attorney, Agent, or Firm—Harness, Dickey & Pierce, P.L.C.

(57) ABSTRACT

A temperature compensated zero bias RF detector circuit includes a zero biased diode detector circuit feeding the positive input of a differential amplifier circuit. The negative input of the same differential amplifier circuit is a temperature compensation voltage. The temperature compensation voltage is produced by current flow from a bias source through a reference diode and through the resistor back to ground. The bias supply remains constant over temperature, whereas the temperature compensation voltage changes with temperature as the forward voltage across the reference diode changes with temperature. The differential amplifier outputs a temperature compensated detection voltage. The differential amplifier is followed by a voltage level shifter, which adjusts the output temperature compensated voltage to a suitable level for measuring equipment or for use by other processing circuits.

20 Claims, 3 Drawing Sheets

TEMPERATURE COMPENSATED, ZERO BIAS RF DETECTOR CIRCUIT

BACKGROUND OF THE INVENTION

1. Field of the Invention

The present invention relates generally to RF (radio frequency) transmission. More particularly, the present invention relates to temperature compensating a zero biased diode RF detector circuit.

2. Description of Related Art

Many aspects of radio and transmitting equipment operation rely on the ability to measure relative and absolute RF power levels. It is common practice to measure relative RF power using a detector diode to detect the peak value of RF voltage presented across a known resistance. Absolute RF power can be calculated directly from the diode voltage at a specific temperature. Relative and absolute RF power measurements, however, may be inaccurate due to changes in detector diode characteristics resulting from temperature variation. In particular, at constant current, the forward voltage drop of detector diodes decreases as temperature increases, typically by 2 mV/° C. Moreover, the rate of change with respect to temperature is further dependent on the bias current of the detector diodes. Temperature dependent changes, if left uncompensated, result in inaccurate RF power level measurements.

In an attempt to correct this problem, circuits have been developed to compensate for diode characteristic changes due to temperature so that accurate RF power measurements can be made over a wide range of temperatures. A conventional implementation of a temperature compensated diode detector circuit utilizes two identical diodes with the same dc bias current passing through each diode. One diode receives the RF energy (detector diode) to be measured while the other diode does not (reference diode). Temperature related changes in forward bias voltage common to both of the diodes are eliminated from the RF measurements by taking the voltage difference between the two diodes. Taking the voltage difference between the two diodes provides a temperature independent voltage proportional only to the RF power level.

In conventional temperature compensating circuits, external bias must be supplied to the detector and reference diodes in order to provide temperature compensation for RF power measurements. Therefore, there continues to be a need for temperature compensating RF power measurements when dc bias is not supplied or is not available to a RF detection diode.

SUMMARY OF THE INVENTION

The temperature compensated zero bias RF detector circuit of the present invention includes a zero biased diode detector circuit feeding the positive input of a differential amplifier circuit. The negative input of the same differential amplifier circuit is a temperature compensation voltage. The temperature compensation voltage is produced by current flow from a bias source through a reference diode and through the resistor back to ground. The bias supply remains constant over temperature, whereas the temperature compensation voltage changes with temperature as the forward voltage across the reference diode changes with temperature. The differential amplifier outputs a temperature compensated detection voltage. The differential amplifier is followed by a voltage level shifter, which adjusts the output temperature compensated voltage to a suitable level for measuring equipment or for use by other processing circuits. Accordingly, the present invention provides temperature compensation of RF power measurements when dc bias is not supplied or is not available to a RF detection diode.

DETAILED DESCRIPTION OF THE INVENTION

Figure 1:
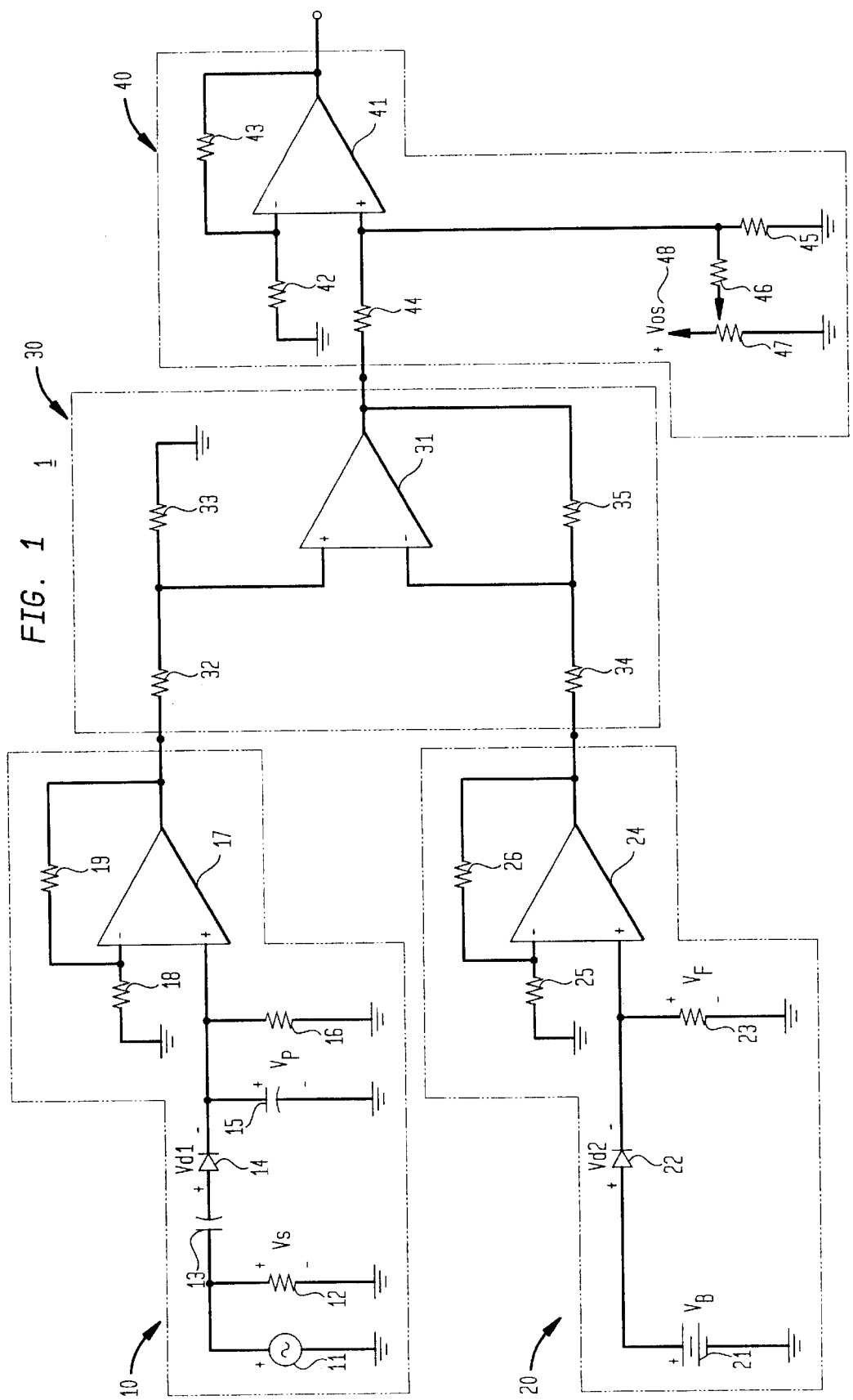
FIG. 1 illustrates one embodiment of the temperature compensated zero bias RF detector circuit of the present invention.

FIG. 1 illustrates one embodiment of the temperature compensated zero bias RF detector circuit 1 of the present invention. As shown in FIG. 1, the temperature compensated zero bias RF detector circuit 1 includes a zero bias diode detector circuit 10 and a temperature compensating circuit 20 which feed the positive and negative input of a differential amplifier circuit 30, respectively. The temperature compensated zero bias RF detector circuit 1 further includes a voltage level shifter 40 which follows the output of the differential amplifier 30. The voltage level shifter 40 adjusts a temperature compensated detection voltage output from the differential amplifier 30 to a suitable level for measuring equipment or use by other processing circuits.

As shown in FIG. 1, the zero bias detector circuit 10 includes a RF source 11, a first resistor 12, a first capacitor 13, a first diode 14, a second capacitor 15, a second resistor 16, a first operational amplifier 17, a third resistor 18, and a fourth resistor 19. The RF source 11 is connected in series to ground and in parallel to the first resistor 12 and the first capacitor 13. The first capacitor 13 is a coupling capacitor and is connected in series to the first diode 14. The first diode 14 is connected to the parallel combination of the second capacitor 15, the second resistor 16, and the positive (non-inverting) terminal of the first operational amplifier 17. The second capacitor 15 is a filter capacitor and is also connected in series to ground. The second resistor 16 is also connected in series to ground.

The third resistor 18 is connected in series to ground and feeds the negative (inverting) terminal of the first operational amplifier 17. The fourth resistor is a negative feedback resistor and is connected to the negative terminal and the output terminal of the first operational amplifier 17.

The temperature compensating circuit 20 includes a dc bias source 21, a second diode 22, a fifth resistor 23, a second operational amplifier 24, a sixth resistor 25, and a seventh resistor 26. The dc bias source 21 is connected in series to ground and to the second diode 22. The second diode 22 is also connected in parallel to the fifth resistor 23 and the positive terminal of the second operational amplifier 24. The sixth resistor 25 is connected in series to ground and feeds the negative terminal of the second operational amplifier 24. The seventh resistor 26 is a negative feedback resistor and is connected to the negative terminal and the output terminal of the second operational amplifier 24.

The differential amplifier 30 includes a third operational amplifier 31, an eighth resistor 32, a ninth resistor 33, a tenth resistor 34, and an eleventh resistor 35. The eighth resistor 32 is connected in series to the output of the first operational amplifier 17 and in parallel to the ninth resistor 33 and the positive terminal of the third operational amplifier 31. The tenth resistor is connected in series to the output of the second operational amplifier 24 and in parallel to the negative input of the third operational amplifier 31 and the eleventh resistor 35. The eleventh resistor 35 is a negative feedback resistor and is connected to the negative terminal and the output terminal of the third operational amplifier 31.

The voltage level shifter 40 includes a fourth operational amplifier 41, a twelfth resistor 42, a thirteenth resistor 43, a fourteenth resistor 44, a fifteenth resistor 45, a sixteenth resistor 46, a seventeenth resistor 47, and an offset voltage source 48. The twelfth resistor 42 is connected in series to ground and feeds the negative terminal of the fourth operational amplifier 41. The thirteenth resistor 43 is a negative feedback resistor and is connected to the negative terminal and the output terminal of the fourth operational amplifier 41. The fourteenth resistor 44 is connected in series to the output of the third operational amplifier 31 and in parallel to the positive terminal of the fourth operational amplifier 41, the fifteenth resistor 45, and the sixteenth resistor 46. The fifteenth resistor 45 is connected in series to ground and in parallel to the sixteenth resistor 46. The sixteenth resistor 47 is variably connected in parallel to the seventeenth resistor 47. The seventeenth resistor is connected in series to ground and in parallel to the voltage source 48. The offset voltage source 48 is also connected in series to ground.

The operation of the temperature compensated zero bias RF detector circuit 1 of the present invention is as follows.

In the zero bias detector circuit 10, no bias circuitry is necessary when RF power levels of the RF source 11 are sufficient to produce a self bias effect on the first diode 14. The first diode 14 is specifically designed for zero biased operation and exhibits the ability to detect RF power over a wide dynamic range. The voltage drop Vd1 of the first diode 14 is about 0.3 volts.

The RF source 11 produces a voltage Vs across the first resistor 12, which has a resistance of RL. The first capacitor 13 couples the voltage Vs to the first diode 14 and behaves like a high-pass filter to block any dc (direct current) component of the voltage Vs. The first diode 14 acts as a half-wave rectifier and rectifies the voltage Vs. The second capacitor 15 connected in parallel to the first diode 14 serves to substantially reduce variation in the rectified voltage. As the first diode 14 conducts, the second capacitor 15 is charged to a peak value Vp. The peak value of the second capacitor is equal to Vs minus the voltage drop Vd1 across the first diode 14. That is:

$$Vp = Vs - Vd1.$$

When the first diode 14 cuts off, the second capacitor 15 discharges through the second resistor 16. The RF power dissipated by the first resistor 12 can be calculated with the following equation.

$$P = \frac{Vs(peak)^2}{2RL},$$

where Vs(peak) is the peak voltage measured across the first resistor 12.

The RF power can also be calculated by the equation:

$$P = \frac{[Vp + V_{d1}(peak)]^2}{2RL},$$

where Vp is the dc voltage developed across the second capacitor 15 and Vd1 is the peak value of the voltage measured across the first diode 14.

Relatively low RF signals levels are sufficient to provide a self bias current through the first diode 14. When the first diode 14 is self biased, the internal resistance of the first diode 14 is much lower than the resistance of the second resistor 16. Therefore, for relatively low power levels, the second capacitor 15 is allowed to charge up to the peak value Vp=Vs−Vd1. The voltage level Vp is proportional to the RF power of the RF source 11.

However, even if the source signal Vs is of respectable voltage, the voltage Vp across the second resistor 16 is loaded down by measurement circuits. As such the voltage Vp cannot be directly used by other circuitry. Therefore, the voltage Vp is fed to the positive input of the first operational amplifier 17. The first operational amplifier 17 in conjunction with the third resistor 18 and the fourth resistor 19 acts like a buffer amplifier in order to amplify the power of the signal. The third resistor 18 has a resistance of R3, and the fourth resistor 19 has a resistance of R4. A buffer amplifier has a high input resistance and a low output resistance but with a modest voltage gain. The output of the first operational amplifier 17 is:

$$Vop1 \approx Vp * \left(1 + \frac{R4}{R3}\right)$$

The voltage Vop1 is fed to the positive terminal of the third operational amplifier 31 of the differential amplifier circuit 30.

The negative input of the third operational amplifier 31 of the differential amplifier circuit 30 is fed from the temperature compensating circuit 20. In the temperature compensating circuit 20, a temperature compensation voltage VF is produced across the fifth resistor 23. The temperature compensation voltage VF is produced by current flow from the dc bias source 21, through the second diode 22 and through the fifth resistor 23 back to ground. The voltage VB supplied by the bias supply 21 remains constant over temperature, whereas the compensation voltage VF changes with temperature. Namely, as the forward voltage Vd2 across the second diode 22 changes with temperature, VF=VB−Vd2 will also change with temperature.

The temperature compensation voltage VF is fed to the positive input of the second operational amplifier 24. The second operational amplifier 24 in conjunction with the sixth resistor 25 and the seventh resistor 26 acts like a buffer amplifier in order to scale the voltage VF. The sixth resistor has a resistance of R6, and the seventh resistor has a resistance of R7. The output of the second operational amplifier is:

$$Vop2 \approx VF * \left(1 + \frac{R7}{R6}\right)$$

The voltage Vop2 is fed to the negative terminal of the third operational amplifier 31 of the differential amplifier circuit 30.

In the differential amplifier circuit 30, the eighth resistor 32 and the ninth resistor 33 act like a voltage divider. The eighth resistor has a resistance of R8, and the ninth resistor has a resistance of R9. The tenth resistor 34 is connected to the negative terminal of the third operational. amplifier 31 and has a resistance of R10. The eleventh resistor 35 is connected to the output and the negative terminal of the third operational amplifier 31 for negative feedback and has a resistance of R11.

When the two voltages Vop1 and Vop2 are presented to the inputs of the differential amplifier circuit 30, the output voltage Vop3 of the third operational amplifier 31 is a function of the difference between the inputs. That is:

$$Vop3 = -\frac{R11}{R10} * Vop2 + \frac{[1+R11/R10]}{[1+R8/R9]} * Vop1, \text{ or}$$

$$Vo = Vp * \frac{\left[1+\frac{R4}{R3}\right]\left[1+\frac{R11}{R10}\right]}{\left[1+\frac{R8}{R9}\right]} - VF\left[1+\frac{R7}{R6}\right]\left[\frac{R11}{R10}\right], \text{ or}$$

$$Vo = (Vs - Vd1) * \frac{\left[1+\frac{R4}{R3}\right]\left[1+\frac{R11}{R10}\right]}{\left[1+\frac{R8}{R9}\right]} - (VB - Vd2)\left[1+\frac{R7}{R6}\right]\left[\frac{R11}{R10}\right]$$

The output voltage Vop3 of the differential amplifier circuit 30 has been compensated for temperature variation and can be used to calculate accurate RF measurements. For different RF power levels, the values of Vb and the resistance R5 of the fifth resistor 23 must be adjusted such that VF is equal in value to Vp at the maximum detected RF power level.

Although the voltage Vop3 can be used to calculate accurate RF power levels, it will often be the case that following circuitry will require voltage different from the temperature compensated voltage Vop3. For example, following circuitry may require a voltage equal to Vop1 to perform properly. In such cases, the voltage Vop3 must be adjusted to a proper level for use by other circuitry. Accordingly, the output of the differential amplifier circuit 30 is followed by a voltage level shifter 40 which adjusts the temperature compensated detection voltage of Vs, i.e., the voltage Vop3, to a suitable level for measuring equipment or use by other processing circuits.

In the voltage level shifter 40, the fourth operational amplifier, the twelfth resistor 42 and the thirteenth resistor 43 provide the desired amplification. The output Vop3 of the differential amplifier 30 is adjusted by the fourteenth resistor 42, the fifteenth resistor 45, the sixteenth resistor 46, the seventeenth resistor (potentiometer) 47, and the offset voltage source 48. The fifteenth resistor 45 and the sixteenth resistor 46 divide the variable voltage produced from the offset voltage source 48 across the seventeenth resistor 47. Because, the sixteenth resistor 46 is variably connected in parallel to the seventeenth resistor 47, the point where the sixteenth resistor 46 connects to the seventeenth resistor 47 determines the voltage to be divided. Accordingly, the output Vc of the voltage level shifter is a function of the voltage Vop3 adjusted to a suitable level for measuring equipment or use by other processing circuits.

Figure 2:
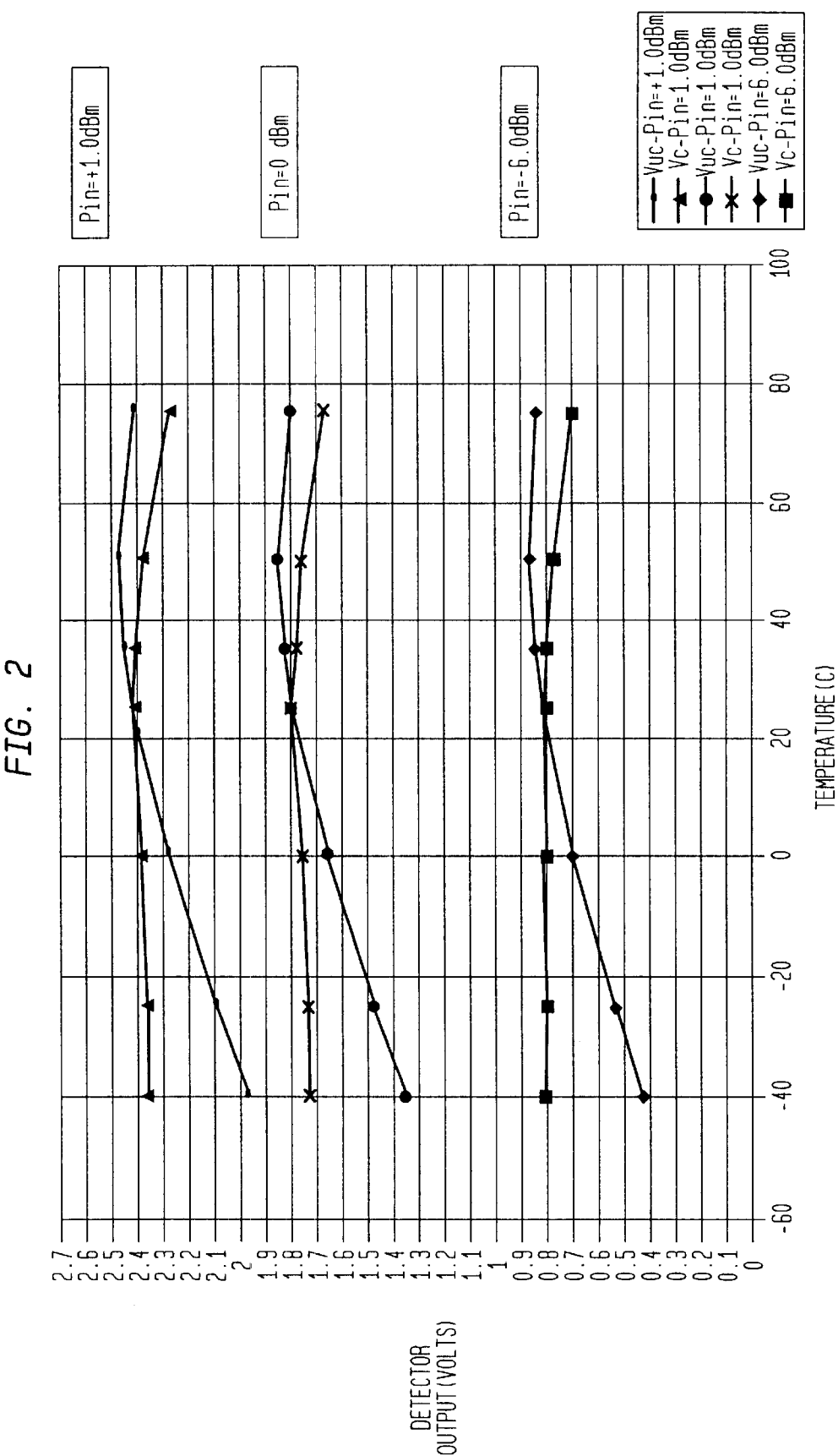
FIG. 2 illustrates the performance of one embodiment of the temperature compensated zero bias RF detector circuit of the present invention.

FIG. 2 illustrates the performance of the temperature compensation circuit of the present invention shown in FIG. 1. Namely, FIG. 2 demonstrates utilizing a detector diode and an identical reference diode biased to produce a voltage drop across a resistor. RF input power was kept constant at +1, 0 and −6 dBm as temperature varied from −40° C. to +75° C. The plots marked Tc represent the temperature compensated output of the circuit illustrated in FIG. 1. As can be seen from the graph in FIG. 2, the temperature compensation method is successful in maintaining the RF detection voltage proportional to the constant RF power level over a wide range of temperatures.

The voltage drop across the load resistor was found to be reasonably good at temperature compensating the zero biased detector. The dynamic range of RF power level in which temperature compensation performance was limited to 7 dB. This range is acceptable for an application of sensing the maximum RF output power of an amplifier.

Figure 3:
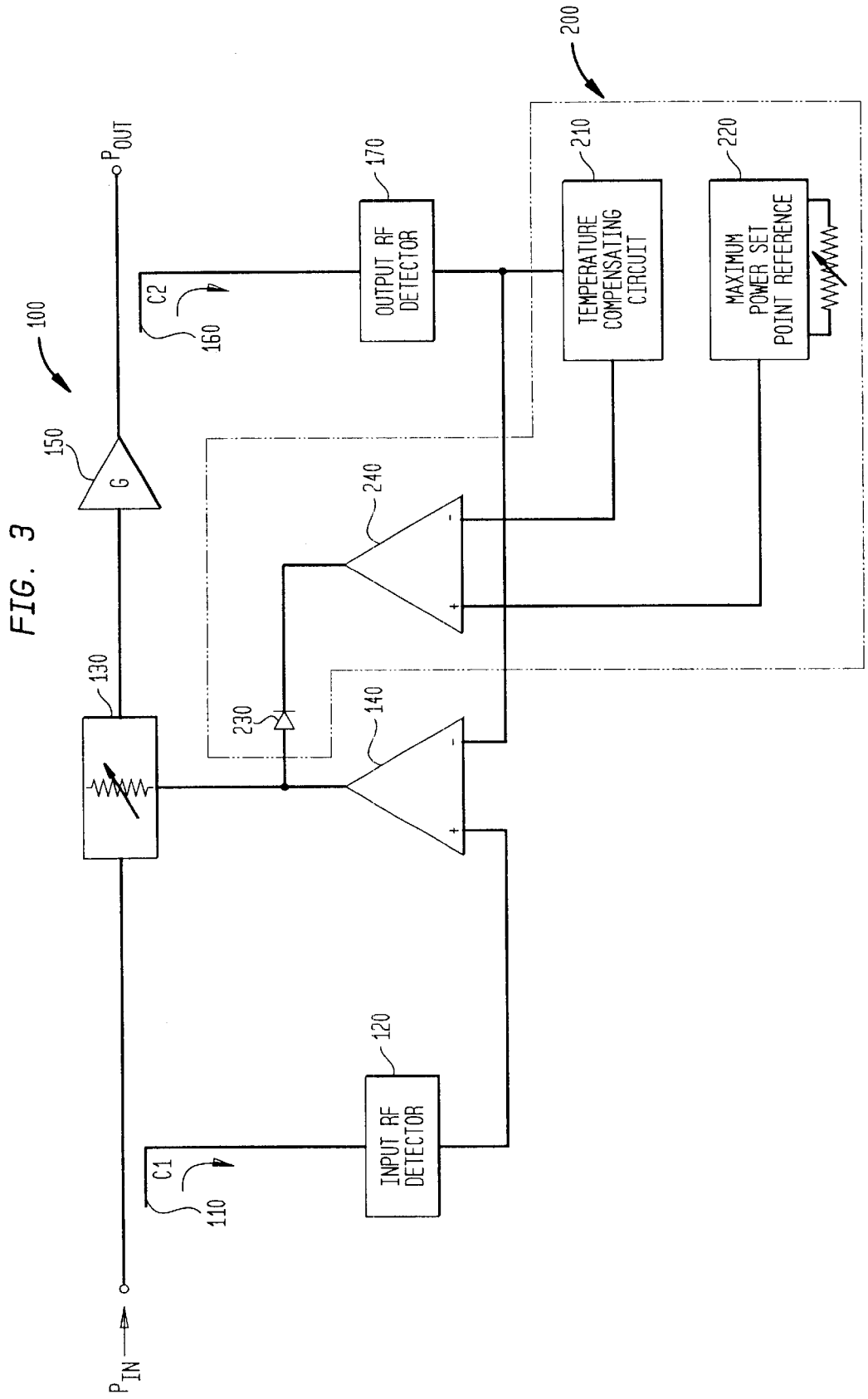
FIG. 3 illustrates another embodiment of the temperature compensated zero bias RF detector circuit of the present invention.

FIG. 3 illustrates the temperature compensated zero bias RF detector circuit of the present invention used in an RF amplifier with AGC (automatic gain control). The purpose of the AGC is to maintain a constant amplification factor or gain regardless of amplifier operating parameters such as temperature, aging, power or supply voltage.

Absolute power measurements are taken from two RF detector circuits to implement the AGC feature. As shown in FIG. 3, the automatic gain control circuit 100 includes an input coupler 110, an input RF detector 110, a variable voltage attenuator 130, a differential (error) amplifier 140, a gain amplifier 150, an output coupler 160, and an output RF detector 170.

Zero biased diode detectors may be used for the input RF detector 110 and the output RF detector 170. The couplers C1 and C2, i.e., the input coupler 110 and the output coupler 160, are chosen such that the RF power level applied to the detector circuts are at similar levels. Temperature compensation of the zero biased diode detectors 110, 170 is unnecessary because temperature affects both detectors in a similar manner. The same temperature related error is applied to both the input detector 110 and the output detector 170 and is eliminated by taking the difference between the outputs of the detectors with the differential amplifier 140. The common temperature related error component is eliminated, leaving only the difference between the output power level and the input power level.

The difference output (error signal) of the differential amplifier 140 functions to control the variable attenuator 130 making the overall gain (Pout/Pin) a constant value that is determined by couplers C1 and C2.

The zero biased diode output detector 170 is not capable of determining the absolute RF output power (Pout) because absolute RF output power will change in value due to changes in temperature even if the RF output power remains constant. One solution is to provide a means of deriving the absolute RF output power from the temperature varying zero biased diode detector. That is, providing a means of temperature compensating the output of the zero biased diode will eliminate the error in the detected voltage caused by temperature.

Application of the present invention, therefore, permits absolute power measurement of the output power Pout. It is useful to know the absolute RF output power of an amplifier to prevent an RF overdrive condition that could cause permanent damage to the amplifier.

As shown in FIG. 3, a means for permitting absolute power measurement of Pout 200 is provided. The temperature compensating circuit of the present invention 210, a voltage reference 220 representing the absolute maximum allowable peak voltage, a summing diode 230 and a differential amplifier 240 allow accurate measurement of the absolute RF output power Pout. The maximum peak output voltage is representative of the maximum RF output power since the load impedance remains constant at 50 Ω and $P_{max} = V_p^2/2R$.

The temperature compensating circuit 210 functions to convert the detected RF output voltage from the zero biased diode detector 170 into the peak RF output voltage independent of temperature. The temperature compensated voltage output from the temperature compensation circuit 210 is applied to one input of the differential amplifier 240. The other input of the differential amplifier 240 is the maximum RF power peak voltage set point determined by the voltage reference 220.

The gain amplifier 150 functions as a RF amplifier with AGC as long as the RF output power remains within the designated RF output power range. Under such conditions, the temperature compensated peak output voltage produced by the temperature compensation circuit 210 is lower in value than the maximum peak output voltage set point determined by the voltage reference 220. The resulting difference output of the differential amplifier 240 is positive. The positive output voltage has no effect on the AGC operation because the summing diode 230 is reversed biased.

The RF output power exceeds the designated RF output power range when the temperature compensated peak output voltage produced by the temperature compensation circuit 210 is higher than the set point determined by the voltage reference 220. Under such conditions, the output of the differential amplifier 240 becomes negative. The negative voltage controls the voltage variable attenuator 130 causing an increase of attenuation and reducing the RF drive level to the gain amplifier 150. The lower drive level results in lower RF output power of the RF gain amplifier 150, effectively limiting the maximum RF output power and avoiding permanent damage. Normal AGC amplifier operation resumes as soon as the RF overdrive condition is removed.

As described above, the present invention provides temperature compensation of RF power measurements when dc bias is not supplied or is not available to a RF detection diode and may be implemented in an RF amplifier with an AGC feature.

What is claimed is:

1. An apparatus comprising:
    a detector circuit including a detector diode for detecting a peak radio frequency level of a source, said source supplying radio frequency levels sufficient to bias the detector diode into a conducting mode without requiring application of external bias, and the detector diode not receiving a bias from other source than the source;
    a temperature compensation voltage generation circuit generating a temperature compensation voltage; and
    a compensating circuit temperature compensating a voltage generated by the detector circuit based on the temperature compensation voltage.

2. The apparatus according to claim 1, wherein said temperature compensation voltage generation circuit includes a reference diode identical to said detector diode.

3. The apparatus according to claim 2, wherein said reference diode is biased by a dc bias source.

4. The apparatus according to claim 1, wherein the compensating circuit comprises:
    a differential amplifier for receiving inputs from said detector circuit and said temperature compensation voltage generation circuit and outputting a temperature compensated voltage in response thereto.

5. The apparatus according to claim 4, further comprising a voltage level shifter adjusting the temperature compensated voltage to a desired voltage level.

6. An apparatus comprising:
    a detector circuit including a detector diode for detecting a peak radio frequency level of a source, said source supplying radio frequency levels sufficient to bias a detector diode into a conducting mode without requiring application of external bias; and
    a temperature compensation circuit for compensating changes in diode characteristics of the detector diode due to temperature variation, said temperature compensation circuit including a buffer amplifier connected to a reference diode.

7. An apparatus comprising:
    detecting means including a detector diode for detecting a peak radio frequency level of a source, said source supplying radio frequency levels sufficient to bias the diode into a conducting mode without requiring application of external bias, and the detector diode not receiving a bias from other source than the source;
    temperature compensation voltage generation means generating a temperature compensation voltage; and
    compensating means temperature compensating a voltage generated by the detector circuit based on the temperature compensation voltage.

8. The apparatus according to claim 7, wherein said temperature compensation voltage generation means including a reference diode identical to said detector diode.

9. The apparatus according to claim 8, wherein said reference diode is biased by a dc bias source.

10. The apparatus according to claim 7, wherein said compensating means comprises:
    differentiating means for receiving inputs from said detecting means and said temperature compensation voltage generation means and outputting a temperature compensated voltage in response thereto.

11. The apparatus according to claim 10, further comprising shifting means for adjusting the temperature compensated voltage to a desired voltage level.

12. An automatic gain control circuit comprising:
    an input RF detector circuit including an input detector diode for detecting a peak radio frequency level of an output, and the detector diode not receiving a bias from other than the output;
    an output RF detector circuit including an output detector diode for detecting a peak radio frequency level of an output; and
    a temperature compensation circuit for compensating changes in diode characteristics of the output detector diode due to temperature variation, said temperature compensation circuit including a reference diode identical to said output detector diode.

13. The apparatus according to claim 12, wherein said reference diode is biased by a dc bias source.

14. The apparatus according to claim 12, wherein said temperature compensation circuit includes a buffer amplifier connected to said reference diode.

15. The apparatus according to claim 12, further comprising a differential amplifier for receiving inputs from said temperature compensation circuit and a voltage reference representing maximum RF power peak voltage.

16. The apparatus according to claim 15, further comprising an error amplifier for receiving inputs from said input RF detector circuit and said output RF detector circuit and outputting an error signal in response thereto.

17. The apparatus according to claim 12, further comprising a summing diode connected between the output of said differential amplifier and said error amplifier.

18. The apparatus according to claim 12, further comprising an error amplifier for receiving inputs from said input RF detector circuit and said output RF detector circuit and outputting an error signal in response thereto.

19. The apparatus according to claim 12, further comprising a gain amplifier for amplifying power of said input by a desired gain.

20. The apparatus according to claim 19, further comprising an attenuator for receiving said error signal and controlling the gain of said gain amplifier in response thereto.

* * * * *